United States Patent
Marshall

(10) Patent No.: US 7,772,890 B2
(45) Date of Patent: Aug. 10, 2010

(54) SYSTEMS AND METHODS FOR DYNAMIC LOGIC KEEPER OPTIMIZATION

(75) Inventor: Andrew Marshall, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/869,785

(22) Filed: Oct. 10, 2007

(65) Prior Publication Data

US 2009/0096485 A1    Apr. 16, 2009

(51) Int. Cl.
*H03K 19/096* (2006.01)

(52) U.S. Cl. .................. 326/95; 326/97; 326/98
(58) Field of Classification Search .............. None
See application file for complete search history.

(56) References Cited

U.S. PATENT DOCUMENTS 7,471,114 B2 * 12/2008 Abadeer et al. ............. 326/95
2006/0214695 A1 * 9/2006 Lih et al. .................... 326/98

* cited by examiner

*Primary Examiner*—Anh Q Tran
(74) *Attorney, Agent, or Firm*—Jacqueline J. Garner; Wade J. Brady, III; Frederick J. Telecky, Jr.

(57) ABSTRACT

Various systems and methods for implementing dynamic logic are disclosed herein. For example, some embodiments of the present invention provide dynamic logic devices with a logic circuit that includes an inverting output buffer, a logic function, a bias transistor, and a current circuit. An input of the logic function is electrically coupled to a logic input, an output of the logic function is electrically coupled to an input of the inverting output buffer, and the logic function exhibits a leakage current. The gate of the bias transistor is electrically coupled to an output of the inverting buffer, and a first leg of the bias transistor is electrically coupled to the input of the inverting buffer. The current circuit supplies a current corresponding to the to a second leg of the bias transistor. In some cases, an improved performance may be achieved for a given leakage, or a reduced leakage may be achieved for a given performance.

9 Claims, 4 Drawing Sheets

US 7,772,890 B2

SYSTEMS AND METHODS FOR DYNAMIC LOGIC KEEPER OPTIMIZATION

BACKGROUND OF THE INVENTION

The present invention is related to electrical logic devices, and in particular to dynamic logic devices.

Dynamic logic circuits utilizing static "keeper" circuits offer an alternative to static logic in situations where increased circuit bandwidth (speed) is desired. FIG. 1 shows an exemplary prior art dynamic logic circuit 100 including a pull-up transistor 110 operating as a keeper circuit. In particular, dynamic logic circuit 100 is a three input OR gate (IN0, IN1, IN2), with another input (IN3) operating as an enable by application to the gate of an enable transistor 160. The logic function implemented by dynamic logic circuit 100 is OUT=(IN3 & (IN0 OR IN1 OR IN2)). Dynamic logic circuits are also available for implementing other logic functions.

In operation, a precharge input 130 may be asserted low shortly before a transition of IN3 to turn on a precharge transistor 132. This allows current from a supply 140 to be available at an input of a buffer 150 and provides for relatively quick switching of an output 120. When IN3 is asserted high, output 120 is set to a logic state reflecting the state of IN0, IN1, IN2. In particular, whenever at least one of IN0, IN1, IN2 are set at a logic '1', respective logic transistor(s) 102, 104, 106 are turned on causing the voltage at an input of an inverting buffer 150 to go to approximately ground. This results in a logic '1' at output 120 because of the inverting nature of inverting buffer 150. Otherwise, the voltage at the input of inverting buffer 150 is forced to approximately the voltage of supply 140 as precharge transistor 130 is turned on.

Pull-up transistor 110 is switched off whenever output 120 is set at a logic '1'. In contrast, when output 120 is set at a logic '0' and precharge transistor 132 is turned on, pull-up transistor 110 is switched on. When, however, precharge transistor 132 is turned off and enable transistor 160 is turned off, the input of inverting buffer 150 floats at a level that causes pull-up transistor 110 to be switched off, but at a level that is just below that required to turn on pull-up transistor 110. In this way, dynamic logic circuit 100 is capable of producing very fast edges and relatively high bandwidth operation.

For fastest operation, the size of pull-up transistor 110 is minimized. However, to assure stability, the size of pull-up transistor 110 is typically substantially larger than enable transistor 160. This provides an ability to pull-up substantially more through pull-up transistor 110 than the offsetting pull-down through enable transistor 160. While this increases stability, it also substantially increases the amount of leakage current associated with pull-up transistor 110. As the voltage of supply 140 is decreased to implement different logic technologies, an increasing portion of the power consumption of dynamic logic circuit 100 corresponds to the aforementioned leakage current. Power expended through leakage current is undesirable.

Thus, for at least the aforementioned reason, there exists a need in the art for advanced dynamic logic devices and systems, and methods for implementing and utilizing dynamic logic.

BRIEF SUMMARY OF THE INVENTION

The present invention is related to electrical logic devices, and in particular to dynamic logic devices.

Some embodiments of the present invention provide dynamic logic devices including a logic circuit and a current circuit. The logic circuit includes an inverting buffer, a bias transistor, and a logic function. An input of the logic function is electrically coupled to a logic input, and an output of the logic function is electrically coupled to an input of the inverting output buffer. The gate of the bias transistor is electrically coupled to an output of the inverting buffer, and one leg of the bias transistor is electrically coupled to the input of the inverting buffer. The current circuit supplies a current corresponding to a leakage current of the logic function to another leg of the bias transistor. In some instances of the aforementioned embodiments, the current supplied by the current circuit and the leakage current of the logic function exhibits a similar variance over voltage and temperature. The logic function may implement, but is not limited to, one or more of the following logic functions either separately or in combination: an OR function, an AND function, a NOR function, a NAND function, an XOR function, an XNOR function, a flip-flop, a latch, and/or a transmission gate.

In some instances of the aforementioned embodiments, the logic function includes at least one logic transistor and a control transistor. In such instances, the current supplied by the current circuit corresponds to a leakage current through the at least one logic transistor and the control transistor.

In various instances of the aforementioned embodiments, the current circuit includes a transistor stack and a current mirror. The transistor stack includes at least one off-state transistor exhibiting the current corresponding to the leakage current. The current mirror is configured to cause the current corresponding to the leakage current to be provided to the other leg of the bias transistor. In one particular instance of the aforementioned embodiments, the current mirror includes a first P-channel device, a second P-channel device and an operational amplifier. In such instances, the source of the first P-channel device and the source of the second P-channel device are electrically coupled to a supply. The drain of the first P-channel device is electrically coupled to the at least one off-state transistor and to a first input of the operational amplifier. The gate of the first P-channel device and the gate of the second P-channel device are electrically coupled to each other and to the output of the operational amplifier, and the drain of the second P-channel device is electrically coupled to the second leg of the bias transistor.

In particular cases the bias transistor is a P-channel pull-up transistor. In such cases, the first leg of the bias transistor is the drain of the bias transistor, and the second leg of the bias transistor is the source of the bias transistor. In some cases, a second input of the operational amplifier is electrically coupled to a voltage reference.

10. The device of claim 9, wherein an increase in the voltage reference causes an increase in the switching speed of the output of the output buffer relative to the logic input; and wherein a decrease in the voltage reference causes an decrease in the leakage current through the at least one logic transistor Other embodiments of the present invention provide methods for reducing leakage current in a dynamic logic circuit operating at a particular switching speed. The methods include providing a logic circuit with a transistor stack of two or more selectable off-state transistors, and at least one logic transistor. The logic transistor may, but is not limited to, part of an OR function, an AND function, a NOR function, a NAND function, an XOR function, an XNOR function, a flip-flop, a latch, or a transmission gate. The methods further include selecting one or more of the selectable off-state transistors such that the leakage current associated with the one or more logic transistors is at least in part replicated by the transistor stack. The methods further include monitoring the leakage current associated with the transistor stack, and modifying a keeper current provided to the logic transistors based on a change to the leakage current associated with the transistor stack. In some instances of the aforementioned embodiments, the logic circuit further includes a voltage reference that in part controls the keeper current. The voltage reference in part controls a switching speed of the logic circuit, and the methods further include selecting a value of the voltage reference. In particular instances of the aforementioned embodiments, the logic circuit includes at least one logic input driving a gate of one of the at least one logic transistors and an output, a state of the output is based at least in part on the state of the at least one logic input, and an increase in the voltage reference causes an increase in the switching speed of the output relative to the logic input. Further, in some instances, a decrease in the voltage reference causes a decrease in the leakage current through the at least one logic transistor.

Yet other embodiments of the present invention provide dynamic logic circuits that include a logic circuit and a current circuit. The logic circuit includes an output buffer, a precharge transistor, a logic function, and a bias transistor. The gate of the precharge transistor is electrically coupled to a precharge input, one leg of the precharge transistor is electrically coupled to a supply, and the other leg of the precharge transistor is electrically coupled to an input of the output buffer. The logic function includes at least one logic transistor. The gate of the at least one logic transistor is electrically coupled to a logic input, and one leg of the at least one logic transistor is electrically coupled to the input of the output buffer. The gate of the bias transistor is electrically coupled to an output of the output buffer, and one leg of the bias transistor is electrically coupled to the input of the output buffer. The current circuit includes a transistor stack and a current mirror. The transistor stack includes at least one off-state transistor exhibiting a leakage current that corresponds at least in part to a leakage current of the at least one logic transistor. The current mirror is configured to cause a current corresponding to the leakage current to be provided to the other leg of the bias transistor.

In one particular instance of the aforementioned embodiments, the at least one off-state transistor is an N-channel device. In such cases, the current mirror includes two P-channel devices and an operational amplifier. In such cases, the source of the first P-channel device and the source of the second P-channel device are electrically coupled to a supply, the drain of the first P-channel device is electrically coupled to the N-channel device and to an input of the operational amplifier, the gate of the first P-channel device and the gate of the second P-channel device are electrically coupled to each other and to the output of the operational amplifier, and the drain of the second P-channel device is electrically coupled to the bias transistor. In some particular instances of the aforementioned embodiments, the bias transistor is a P-channel pull-up transistor, and the source of the P-channel pull-up transistor is electrically coupled to the drain of the second P-channel device. Another input of the operational amplifier is electrically coupled to a voltage reference. In some such cases, an increase in the voltage reference causes an increase in the switching speed of the output of the output buffer relative to the logic input; and a decrease in the voltage reference causes an decrease in the leakage current.

This summary provides only a general outline of some embodiments according to the present invention. Many other objects, features, advantages and other embodiments of the present invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several drawings to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present invention is related to electrical logic devices, and in particular to dynamic logic devices.

Various embodiments of the present invention utilize a keeper circuit that is dynamically "sized" to variably control a counteracting leakage current. Such "sizing" may be accomplished through implementation of a dynamic current source circuit that provides a continuously variable keeper current. As just one advantage of such an approach, output switching speed may be increased when compared with a corresponding dynamic logic circuit using a static keeper circuit for the same level of leakage current. As yet another advantage, leakage current may be decreased while yielding the same switching speed as a corresponding dynamic logic circuit using a static keeper circuit. Based on the disclosure provided herein, one of ordinary skill in the art will recognize a variety of other advantages that may be achieved through implementation of one or more embodiments of the present invention.

Figure 1:
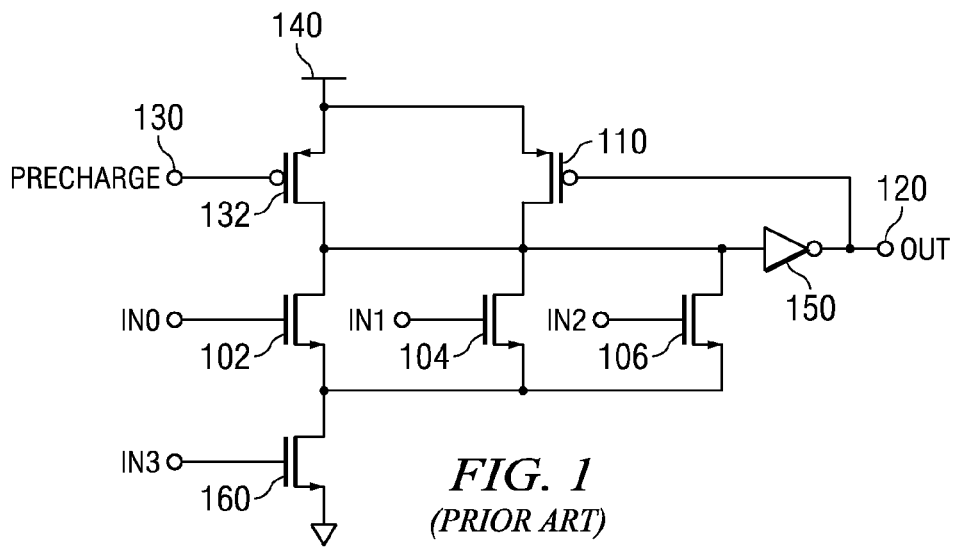
FIG. 1 depicts an exemplary prior art dynamic logic circuit.
Figure 2:
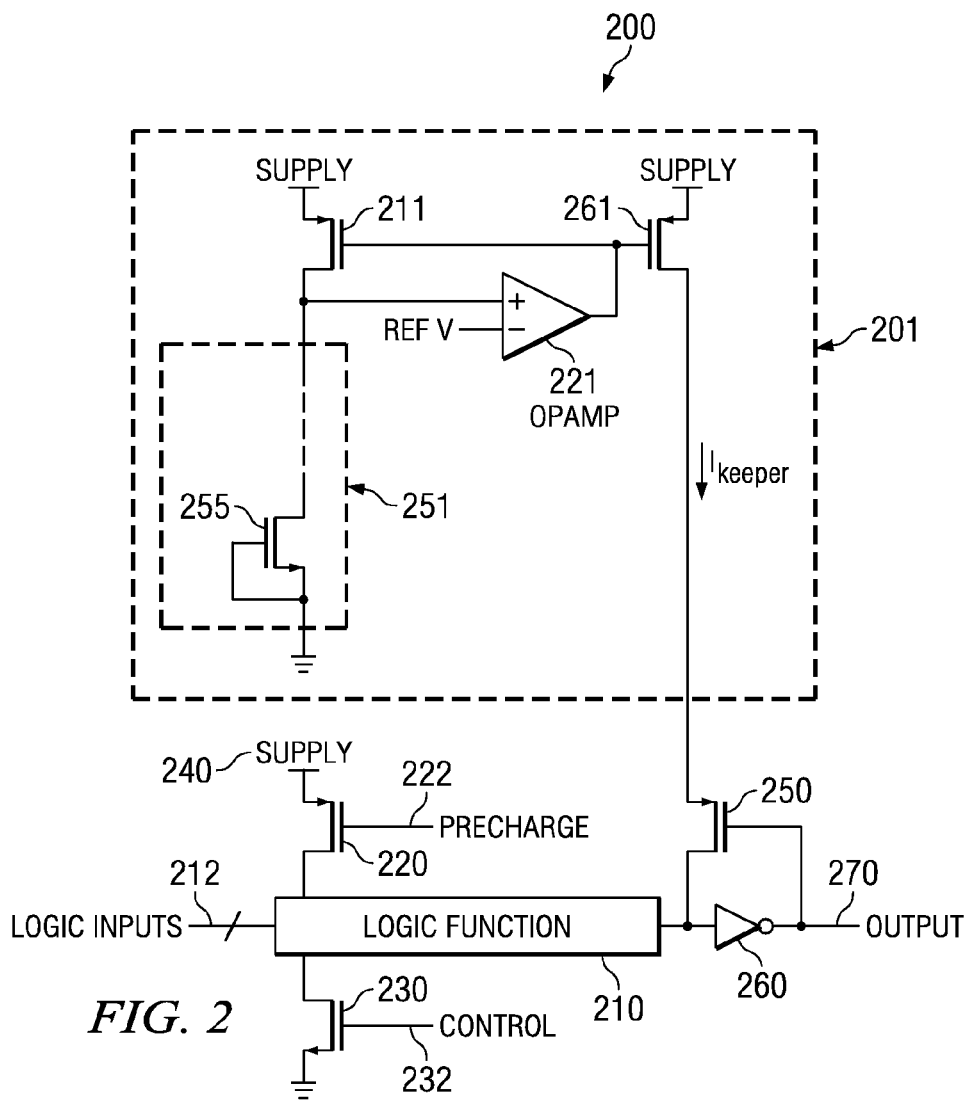
FIG. 2 depicts a dynamic logic circuit in accordance with one or more embodiments of the present invention.

Turning to FIG. 2, a dynamic logic circuit 200 in accordance with one or more embodiments of the present invention is depicted. Dynamic logic circuit 200 includes a logic function 210 that is switched based on one or more logic inputs 212. Logic function 210 may be a group of transistors assembled in such a way as to produce a desired logic output. Thus, for example, logic function 210 may be, but is not limited to, an AND function, an OR function, a NAND function, a NOR function, an XOR function, and/or combinations of the aforementioned functions. Based on the disclosure provided herein, one of ordinary skill in the art will recognize a variety of different logic functions that may be implemented as logic function 210.

In operation, a precharge input 222 may be asserted low shortly before or coincident with a transition of a control input 232 to turn on a P-channel precharge transistor 220. This allows current from a supply 240 to be available to logic function 210 to provide for relatively quick switching of an output 270. When control input 232 is asserted high, an N-channel control transistor 230 is switched on allowing logic inputs 212 to control the state of output 270 via an inverting buffer 260. The input of inverting buffer 260 is coupled to the drain of a pull-up transistor 250, and the gate of pull-up transistor 250 is electrically coupled to output 270. Thus, pull-up transistor 250 is switched on and off based on output 270, and pull-up transistor 250 in part controls output 270. In particular, pull-up transistor 250 is switched off whenever output 270 is set at a logic '1'. In contrast, when output 270 is set at a logic '0' and precharge transistor 222 is turned on, pull-up transistor 250 is switched on. When, however, precharge transistor 222 is turned off and control transistor 232 is turned off, the input of inverting buffer 260 floats at a level that causes pull-up transistor 250 to switch off, but at a level that is just below turning pull-up transistor 250 on. In this way, dynamic logic circuit 200 is capable of producing very fast edges and relatively high bandwidth operation.

Pull-up transistor 250 switches a reference current ($I_{keeper}$) to the input of inverting buffer 260. $I_{keeper}$ is generated by a current circuit 201 shown in dashed lines. Current circuit 201 includes a P-channel transistor 211 with its drain electrically coupled to one input of an operational amplifier 221, its gate electrically coupled to the output of operational amplifier 221, and its source electrically coupled to supply 240. The drain of P-channel transistor 211 is also electrically coupled to a transistor stack 251 outlined using dashed lines. As shown, transistor stack 251 includes one or more transistors 255. In particular, transistor stack 251 is selected to match the leakage resulting from the transistors included in logic function 210 and control transistor 230. In particular, one or more transistors may be configured similar to transistor 255 such that they incur about the same leakage current of those transistors that they are designed to counteract. In particular instances of the aforementioned embodiments, transistor stack 251 includes a number of transistors configured similar to transistor 255 that may be selectably included to perform the matching function. In one particular case, between two and five transistors may be selectably included in a transistor stack to allow for matching (e.g., a stack similar to that shown in FIG. 5 and discussed below may be selected). The output of operational amplifier 221 additionally drives the gate of a P-channel current source transistor 261. The source of current source transistor 261 is electrically coupled to supply 240, and the drain of current source transistor 261 is electrically coupled to pull-up transistor 250. Thus, the output of operational amplifier 221 controls the magnitude of $I_{keeper}$.

In operation, operational amplifier 221 causes the voltage at the drain of P-channel transistor 211 to equal a reference voltage. This results in turning P-channel transistor 211 on sufficiently to overcome the leakage current through transistor stack 251, and to turn current source transistor 261 on to an equivalent amount. Thus, where transistor stack 251 substantially matches the transistors in logic function 210 and control transistor 230, $I_{keeper}$ acts as a leakage current offset. Such a leakage current offset allows for substantially quicker switching speeds at about the same leakage current when compared with prior art dynamic logic circuits. By controlling the voltage reference to operational amplifier 221, dynamic logic circuit 200 may be tailored for quicker operation at the same leakage current when compared with prior art dynamic logic circuits, or may be tailored for operation at the same speed as a prior art dynamic logic circuit while exhibiting reduced leakage current.

Figure 3A:
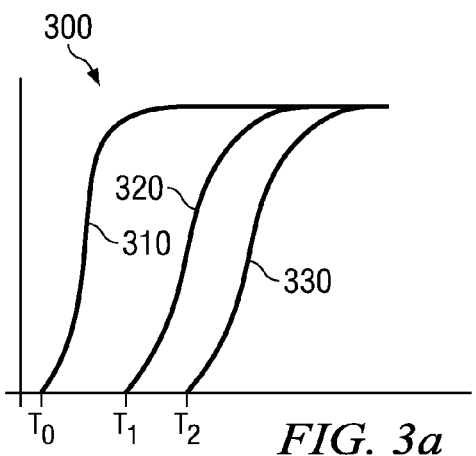
FIG. 3a is a graph showing operation of exemplary dynamic logic circuits in accordance with different embodiments of the present invention where everything is equal except for the applied reference voltage.

Turning to FIG. 3a, a graph 300 depicts a switching speed of a dynamic logic circuit in accordance with an exemplary embodiment of the present invention where the reference voltage is set at two different values. In particular, FIG. 3a shows voltage on a vertical axis verses time on a horizontal axis. A waveform 310 shows the transition of a logic input signal (i.e., one or more of logic inputs 212). A waveform 320 shows output 270 based on a first value for the voltage reference, and waveform 330 shows output 270 based on a second value for the voltage reference. As shown, the first value is greater than the second value. As the value of the voltage reference is greater, waveform 320 transitions sooner (i.e. at a time $t=T_1$) than waveform 330 (i.e., at a time $t=T_2$).

Figure 3B:
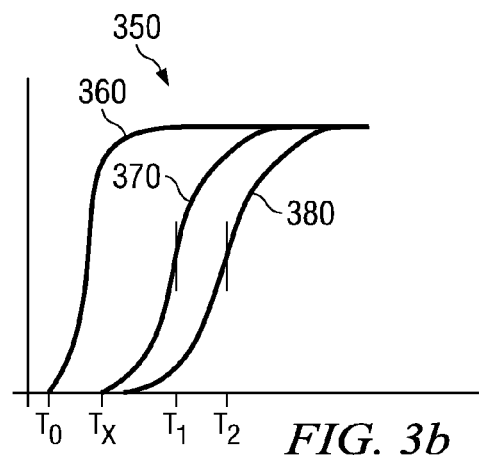
FIG. 3b is a graph depicting switching speed of a dynamic logic circuit in accordance with an exemplary embodiment of the present invention compared to that of a prior art dynamic logic circuit operating at approximately the leakage current.

Turning to FIG. 3b, a graph 350 depicts switching speed of a dynamic logic circuit in accordance with an exemplary embodiment of the present invention compared to that of a prior art dynamic logic circuit operating at approximately the leakage current. In particular, FIG. 3b shows voltage on a vertical axis verses time on a horizontal axis. A waveform 360 shows the transition of a logic input signal (e.g., one or more of logic inputs 212 of dynamic logic circuit 200 and/or one or more of IN0, IN1 or IN2 of dynamic logic circuit 100). A waveform 370 shows output 270 of dynamic logic circuit 200 when input 360 is applied to one or more of logic inputs 212, and waveform 330 shows output 120 of dynamic logic circuit 100 when input 360 is applied to one or more of IN0, IN1 or IN2. As shown, for approximately the same level of leakage current and the same input stimulus (i.e., waveform 360), the output of a dynamic logic device in accordance with one or more embodiments of the present invention switches faster than an output of a corresponding prior art dynamic logic device.

Figure 4:
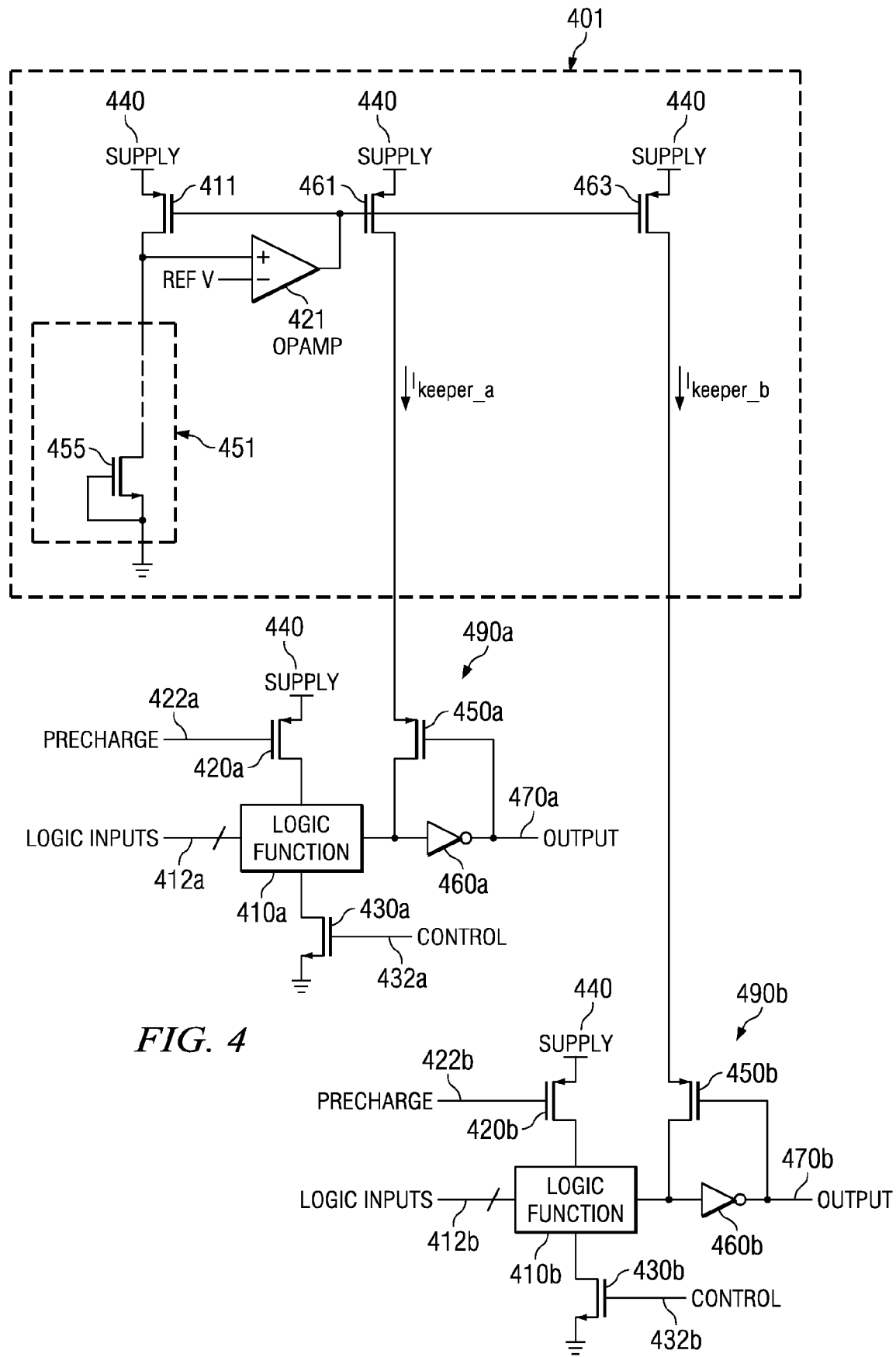
FIG. 4 shows a dynamic logic circuit including one current circuit driving two or more different logic circuits in accordance with various embodiments of the present invention.

Turning to FIG. 4, a dynamic logic circuit 400 including one current circuit 401 driving two or more different logic circuits is depicted in accordance with various embodiments of the present invention. Dynamic logic circuit 400 includes two logic circuits 490a, 490b that are each in part controlled by current circuit 451. It should be noted that while two logic circuits 490a, 490b are depicted, other embodiments of the present invention may include more or fewer than two logic circuits. Logic circuits 490 each include a logic function 410 that is switched based on one or more logic inputs 412. Logic function 410 may be a group of transistors assembled in such a way as to produce a desired logic output. Thus, for example, logic function 410 may be, but is not limited to, an AND function, an OR function, a NAND function, a NOR function, an XOR function, and/or combinations of the aforementioned functions. In some cases, logic function 410a is the same as logic function 410b, while in other cases logic function 410a is different from logic function 410b. Based on the disclosure provided herein, one of ordinary skill in the art will recognize a variety of different logic functions that may be implemented as logic function 410a and/or logic function 410b.

In operation, a precharge input 422 may be asserted low shortly before or coincident with a transition of a control input 432 to turn on a P-channel precharge transistor 420. This allows current from a supply 440 to be available to logic function 410 to provide for relatively quick switching of an output 470. When control input 432 is asserted high, an N-channel control transistor 430 is switched on allowing logic inputs 412 to control the state of output 470 via an inverting buffer 460. The input of inverting buffer 460 is coupled to the drain of a pull-up transistor 450, and the gate of pull-up transistor 450 is electrically coupled to output 470. Thus, pull-up transistor 450 is switched on and off based on output 470, and pull-up transistor 450 in part controls output 470. In particular, pull-up transistor 450 is switched off whenever output 470 is set at a logic '1'. In contrast, when output 470 is set at a logic '0' and precharge transistor 422 is turned on, pull-up transistor 450 is switched on. When, however, precharge transistor 422 is turned off and control transistor 432 is turned off, the input of inverting buffer 460 floats at a level that causes pull-up transistor 450 to switch off, but at a level that is just below turning pull-up transistor 450 on. In this way, dynamic logic circuit 400 is capable of producing very fast edges and relatively high bandwidth operation.

Pull-up transistor 450a switches a first reference current ($I_{keeper\_a}$) to the input of inverting buffer 460a, and pull-up transistor 450b switches a second reference current ($I_{keeper\_b}$) to the input of inverting buffer 460b. $I_{keeper\_a}$ and $I_{keeper\_b}$ are generated by current circuit 401 shown in dashed lines. Current circuit 401 includes a P-channel transistor 411 with its drain electrically coupled to one input of an operational amplifier 421, its gate electrically coupled to the output of operational amplifier 421, and its source electrically coupled to supply 440. The drain of P-channel transistor 411 is also electrically coupled to a transistor stack 451 outlined using dashed lines. As shown, transistor stack 451 includes one or more transistors 455. In particular, transistor stack 451 is selected to match the leakage resulting from the transistors included in logic function 410 and control transistor 430. In particular, one or more transistors may be configured similar to transistor 455 such that they incur about the same leakage current of those transistors that they are designed to counteract. Transistor stack 451 is selected to match or otherwise approximate the leakage resulting from the transistors included in logic function 410a and control transistor 430a, or logic function 410b and control transistor 430b. In some particular cases, the leakage current through logic function 410a and control transistor 430a is approximately the same as that through logic function 410b and control transistor 430b. The output of operational amplifier 421 additionally drives the gate of a P-channel current source transistor 461 and the gate of another P-channel current source transistor 463. The source of current source transistor 461 is electrically coupled to supply 440, and the drain of current source transistor 461 is electrically coupled to pull-up transistor 450a. Similarly, the source of current source transistor 463 is electrically coupled to supply 440, and the drain of current source transistor 463 is electrically coupled to pull-up transistor 450b. Thus, the output of operational amplifier 421 controls the magnitude of $I_{keeper\_a}$ and $I_{keeper\_b}$.

In operation, operational amplifier 421 causes the voltage at the drain of P-channel transistor 411 to equal a reference voltage. This results in turning P-channel transistor 411 on sufficiently to overcome the leakage current through transistor stack 451, and to turn both current source transistor 461 and current source transistor 463 on to an equivalent amount. Thus, where transistor stack 451 substantially matches the transistors in logic function 410a and control transistor 430a, $I_{keeper\_a}$ acts as a leakage current offset for logic circuit 490a; and where transistor stack 451 substantially matches the transistors in logic function 410b and control transistor 430b, $I_{keeper\_b}$ acts as a leakage current offset for logic circuit 490b. Such a leakage current offset allows for substantially quicker switching speeds at about the same leakage current when compared with prior art dynamic logic circuits. By controlling the voltage reference to operational amplifier 421, dynamic logic circuit 400 may be tailored for quicker operation at the same leakage current when compared with prior art dynamic logic circuits, or may be tailored for operation at the same speed as a prior art dynamic logic circuit while exhibiting reduced leakage current.

It should be noted that while two logic circuits 490a, 490b are depicted, that other embodiments of the present invention may include more or fewer than two logic circuits. Each additional logic circuit may include its own current source transistor supplying current to a pull-up transistor. Based on the disclosure provided herein, one of ordinary skill in the art will recognize a variety of current mirror circuits that may be used to replicate $I_{keeper}$ for use with the additional logic circuits.

Figure 5:
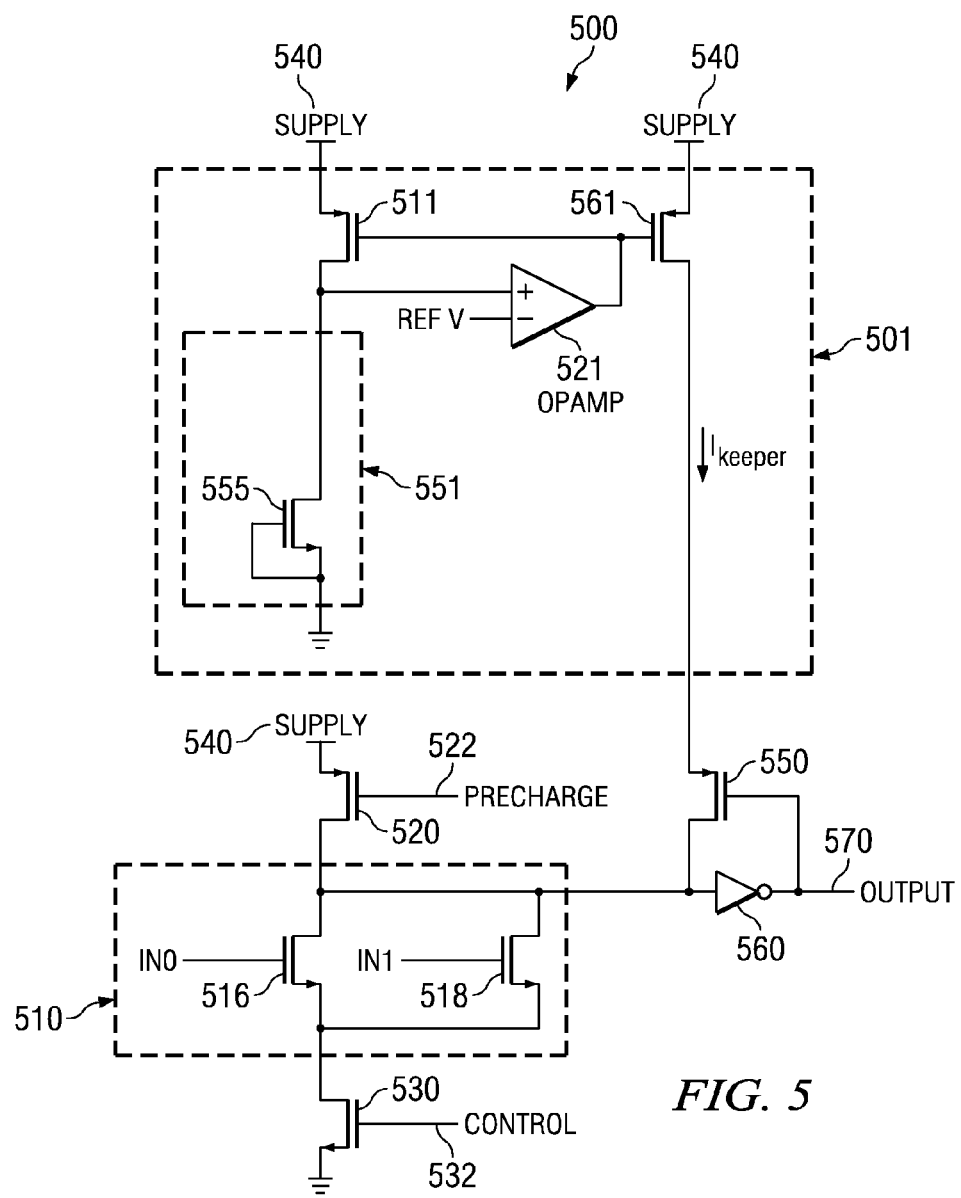
FIG. 5 depicts a two input dynamic logic OR gate in accordance with some embodiments of the present invention.

Turning to FIG. 5, a two input dynamic logic OR gate 500 in accordance with one or more embodiments of the present invention is depicted. Again, it should be noted that the OR function is just one of a number of functions that may be implemented in accordance with embodiments of the present invention. For example, an AND function, an OR function, a NAND function, a NOR function, an XOR function, and/or combinations of the aforementioned functions may be implemented in accordance with different embodiments of the present invention.

Two input dynamic logic OR gate 500 includes a logic function 510 implementing a two input logic function. In particular, logic function 510 includes two logic transistors 516, 518 that are arranged to implement the aforementioned OR function. In particular, whenever either or both of IN0 and IN1 are at a logic '1', and the control pin is also at a logic '1', an output 570 is at a logic '1'. Otherwise, output 570 is at a logic '0'. In operation, a precharge input 522 may be asserted low shortly before or coincident with a transition of a control input 532 to turn on a P-channel precharge transistor 520. This allows current from a supply 540 to be available to logic transistors 516, 518 to provide for relatively quick switching of output 570. When control input 532 is asserted high, an N-channel control transistor 530 is switched on allowing IN0 and IN1 to control the state of output 570 via an inverting buffer 560. The input of inverting buffer 560 is coupled to the drain of a pull-up transistor 550, and the drains of logic transistors 516, 518. The gate of pull-up transistor 550 is electrically coupled to output 570. Thus, pull-up transistor 550 is switched on and off based on output 570, and pull-up transistor 550 in part controls output 570. In particular, pull-up transistor 550 is switched off whenever output 570 is set at a logic '1'. In contrast, when output 570 is set at a logic '0' and precharge transistor 520 is turned on, pull-up transistor 550 is switched on. When, however, precharge transistor 520 is turned off and control transistor 530 is turned off, the input of inverting buffer 560 floats at a level just below its point of switching, as a result of the balance of current being sourced through pull-up transistor 550 and current being sunk by the combination of transistors 516, 518 and 530. In this way, dynamic logic circuit 500 is capable of producing very fast edges and relatively high bandwidth operation.

Pull-up transistor 550 switches a reference current ($I_{keeper}$) to the input of inverting buffer 560. $I_{keeper}$ is generated by a current circuit 501 shown in dashed lines. Current circuit 501 includes a P-channel transistor 511 with its drain electrically coupled to one input of an operational amplifier 521, its gate electrically coupled to the output of operational amplifier 521, and its source electrically coupled to supply 540. The drain of P-channel transistor 511 is also electrically coupled to a transistor stack 551 outlined using dashed lines. As shown, transistor stack 551 includes an N-channel transistor 555, but may include more transistors assembled in a stack. In particular, transistor stack 551 is selected to match the leakage resulting from control transistor 530. The output of operational amplifier 521 additionally drives the gate of a P-channel current source transistor 561. The source of current source transistor 561 is electrically coupled to supply 540, and the drain of current source transistor 561 is electrically coupled to pull-up transistor 550. Thus, the output of operational amplifier 521 controls the magnitude of $I_{keeper}$.

In operation, operational amplifier 521 causes the voltage at the drain of P-channel transistor 511 to equal a reference voltage. This results in turning P-channel transistor 511 on sufficiently to overcome the leakage current through transistor stack 551, and to turn current source transistor 561 on to an equivalent amount. Thus, where transistor stack 551 substantially matches the leakage of control transistor 530, $I_{keeper}$ acts as a leakage current offset. Such a leakage current offset allows for substantially quicker switching speeds at about the same leakage current when compared with prior art dynamic logic circuits. By controlling the voltage reference to operational amplifier 521, dynamic logic circuit 500 may be tailored for quicker operation at the same leakage current when compared with prior art dynamic logic circuits, or may be tailored for operation at the same speed as a prior art dynamic logic circuit while exhibiting reduced leakage current.

Figure 6:
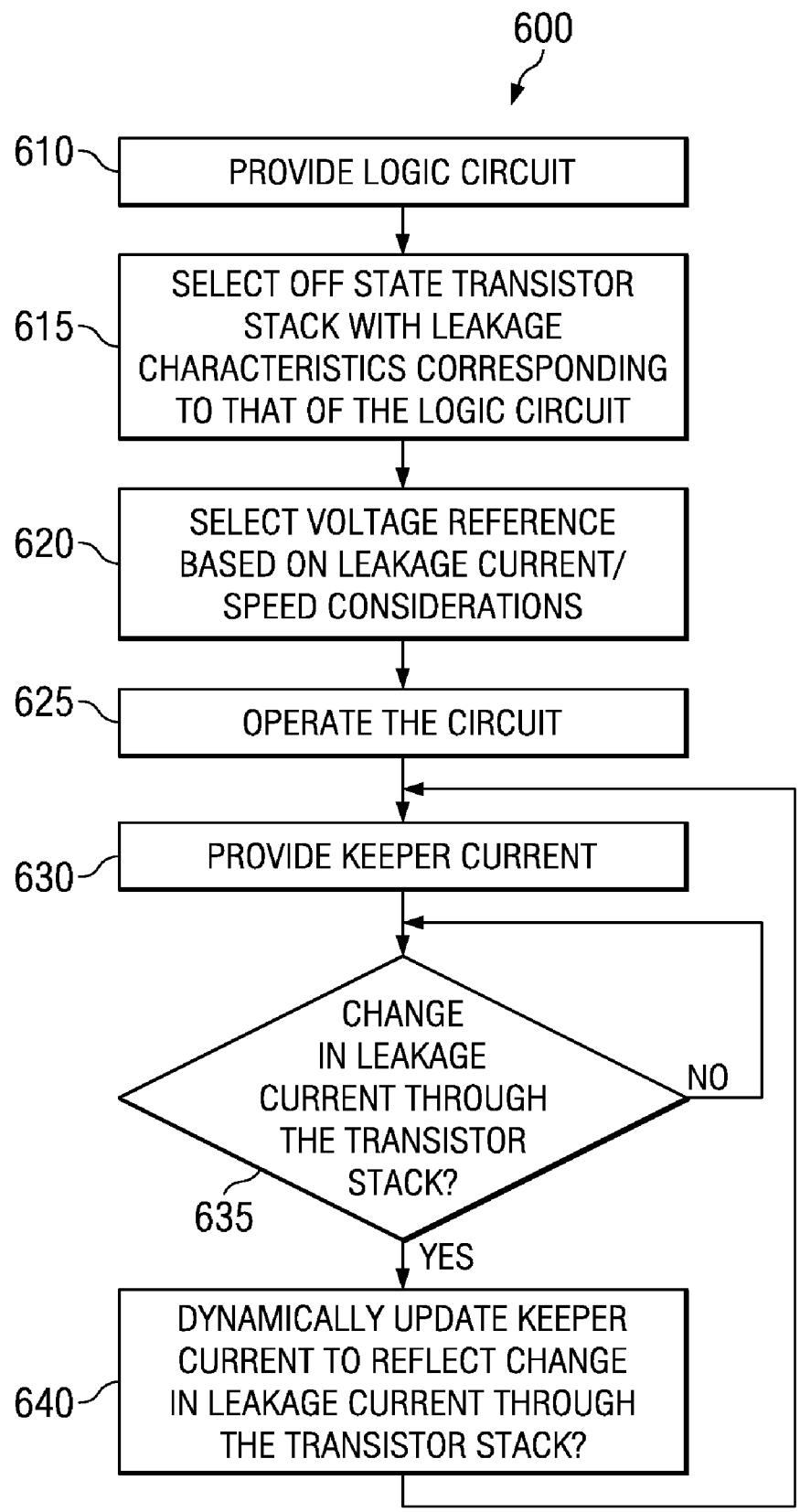
FIG. 6 depicts a method in accordance with some embodiments of the present invention for dynamically controlling leakage current and switching speed in a dynamic logic device.

Turning to FIG. 6, a flow diagram 600 depicts a method in accordance with some embodiments of the present invention for dynamically controlling leakage current and switching speed in a dynamic logic device. Following flow diagram 600, a logic circuit is provided (block 610). The logic circuit may be, but is not limited to, an AND function circuit, an OR function circuit, a NAND function circuit, a NOR function circuit, an XOR function circuit, and/or combinations of the aforementioned function circuits. The logic circuit includes a current circuit with a number of selectable leakage current transistors and a voltage reference operable to select a current output from the current circuit. One or more leakage current transistors are selected for inclusion in circuit operation (block 615). The number of leakage transistors may be selected to match or approximate a leakage current incurred when other transistors in the logic circuit are in an off state. In addition, the value of the voltage reference is selected (block 620). Selection of the value of the voltage reference may be based on a desired tradeoff between reduction in leakage current and switching speed of the logic circuit. For example, where a relatively high switching speed is desired, the value of the voltage reference may be increased. In contrast, where a relatively low leakage current is desired, the value of the voltage reference may be decreased.

The circuit may be operated (block 625) such that a keeper current is generated by the current circuit and provided to a logic portion of the circuit via either a pull-up or a pull-down transistor (block 630). It is then determined whether the leakage current through the transistor stack has changed (block 635). Where the leakage current has not changed (block 635), no changes are made. Alternatively, where the leakage current has changed (block 635), the keeper current is dynamically changed to reflect the changed in the leakage current (block 640) and the updated keeper current is applied (block 630).

In conclusion, the present invention provides novel systems, devices, methods and arrangements for utilizing dynamic logic. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A dynamic logic device, the device comprising:
a logic circuit, wherein the logic circuit includes:
an inverting output buffer;
a logic function, wherein an input of the logic function is electrically coupled to a logic input, wherein an output of the logic function is electrically coupled to an input of the inverting output buffer, and wherein the logic function exhibits a leakage current; and
a bias transistor, wherein the gate of the bias transistor is electrically coupled to an output of the inverting buffer, and wherein a first leg of the bias transistor is electrically coupled to the input of the inverting buffer; and
a current circuit, wherein the current circuit supplies a current to a second leg of the bias transistor, wherein the current circuit includes:
a transistor stack, wherein the transistor stack includes at least one off-state transistor exhibiting the current corresponding to the leakage current; and
a current mirror, wherein the current mirror is configured to cause the current corresponding to the leakage current to be provided to the second leg of the bias transistor, wherein the current mirror includes a first P-channel device, a second P-channel device and an operational amplifier; and wherein the source of the first P-channel device and the source of the second P-channel device are electrically coupled to a supply, wherein the drain of the first P-channel device is electrically coupled to the at least one off-state transistor and to a first input of the operational amplifier, wherein the gate of the first P-channel device and the gate of the second P-channel device are electrically coupled to each other and to the output of the operational amplifier, and wherein the drain of the second P-channel device is electrically coupled to the second leg of the bias transistor.

2. The device of claim 1, wherein the bias transistor is a P-channel pull-up transistor, wherein the first leg of the bias transistor is the drain of the bias transistor, and wherein the second leg of the bias transistor is the source of the bias transistor.

3. The device of claim 1, wherein a second input of the operational amplifier is electrically coupled to a voltage reference.

4. The device of claim 3, wherein an increase in the voltage reference causes an increase in the switching speed of the output of the output buffer relative to the logic input; and wherein a decrease in the voltage reference causes an decrease in the leakage current.

5. A dynamic logic circuit, the circuit comprising:
a logic circuit, wherein the logic circuit includes:
an output buffer;
a precharge transistor, wherein the gate of the precharge transistor is electrically coupled to a precharge input, wherein one leg of the precharge transistor is electrically coupled to a supply, and wherein the other leg of the precharge transistor is electrically coupled to an input of the output buffer;
a logic function, wherein the logic function includes at least one logic transistor, wherein a logic input is electrically coupled to the gate of the at least one logic transistor, and wherein a leg of the at least one logic transistor is electrically coupled to the input of the output buffer; and
a bias transistor, wherein the gate of the bias transistor is electrically coupled to an output of the output buffer, and wherein one leg of the bias transistor is electrically coupled to the input of the output buffer;

a current circuit, wherein the current circuit includes:

a transistor stack, wherein the transistor stack includes at least one off-state transistor exhibiting a leakage current, and wherein the leakage current corresponds at least in part to a leakage current of the at least one logic transistor; and a current mirror, wherein the current mirror is configured to cause a current corresponding to the leakage current to be provided to the other leg of the bias transistor, wherein the at least one off-state transistor is an N-channel device, and wherein the current mirror includes: a first P-channel device, a second P-channel device and an operational amplifier.

6. The circuit of claim 5, wherein the source of the first P-channel device and the source of the second P-channel device are electrically coupled to a supply, wherein the drain of the first P-channel device is electrically coupled to the N-channel device and to an input of the operational amplifier, wherein the gate of the first P-channel device and the gate of the second P-channel device are electrically coupled to each other and to the output of the operational amplifier, and wherein the drain of the second P-channel device is electrically coupled to the bias transistor.

7. The circuit of claim 6, wherein the bias transistor is a P-channel pull-up transistor, and wherein the source of the P-channel pull-up transistor is electrically coupled to the drain of the second P-channel device.

8. The circuit of claim 6, wherein another input of the operational amplifier is electrically coupled to a voltage reference.

9. The circuit of claim 8, wherein an increase in the voltage reference causes an increase in the switching speed of the output of the output buffer relative to the logic input; and wherein a decrease in the voltage reference causes an decrease in the leakage current through the at least one logic transistor.

* * * * *